Figure 1:
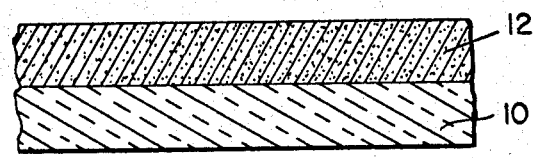

United States Patent [19]

Doering

[11] 4,250,242

[45] Feb. 10, 1981

[54] UNIFORM EXPOSURE OF POSITIVE-ACTING DIAZO TYPE MATERIALS THROUGH SUPPORT

[75] Inventor: August P. Doering, North Windham, Me.

[73] Assignee: American Hoechst Corporation, Bridgewater, N.J.

[21] Appl. No.: 956,528

[22] Filed: Oct. 31, 1978

Related U.S. Application Data

[60] Division of Ser. No. 815,355, Jul. 13, 1977, Pat. No. 4,154,613, which is a continuation-in-part of Ser. No. 652,249, Jan. 26, 1976, abandoned, which is a continuation-in-part of Ser. No. 189,104, Oct. 14, 1971, abandoned.

[51] Int. Cl.³ .......................... G03C 1/58; G03C 5/22
[52] U.S. Cl. .................................... 430/141; 430/326; 430/327; 430/394; 430/494
[58] Field of Search ............... 96/27 R, 27 E, 33, 35.1, 96/49; 430/168, 141, 327, 326, 394, 494

[56] References Cited

U.S. PATENT DOCUMENTS

| | | | |
|---|---|---|---|
| 3,005,708 | 10/1961 | Hesse | 96/36.1 |
| 3,032,414 | 5/1962 | James et al. | 430/169 |
| 3,241,973 | 3/1966 | Thommes | 96/35.1 |
| 3,259,499 | 7/1966 | Thommes | 96/35.1 |
| 3,313,626 | 4/1967 | Whitney | 96/33 |
| 3,355,295 | 11/1967 | Priest | 430/176 |
| 3,635,711 | 6/1969 | Miller et al. | 96/35.1 |
| 3,759,711 | 9/1973 | Rauner et al. | 96/36 |

*Primary Examiner*—Edward C. Kimlin
*Attorney, Agent, or Firm*—James E. Bryan

[57] ABSTRACT

This invention relates to an improvement in a material adapted for imagewise exposure to actinic light comprising a transparent or translucent support having a positive-acting quinone diazide light-sensitive coating composition in direct contact with one surface thereof, the improvement comprising that the surface of said coating in direct contact with said support is substantially photodecomposed, and that a gradient exists in said coating wherein the percentage of undecomposed light-sensitive quinone diazide increases with increasing distance from said support. The invention also relates to a method for preparing the novel material.

9 Claims, 3 Drawing Figures

UNIFORM EXPOSURE OF POSITIVE-ACTING DIAZO TYPE MATERIALS THROUGH SUPPORT

This is a division of application Ser. No. 815,355, filed July 13, 1977, now U.S. Pat. No. 4,154,613, which is, in turn, a continuation-in-part of copending application Ser. No. 652,249, filed Jan. 26, 1976, in turn a continuation-in-part of application Ser. No. 189,104, filed Oct. 14, 1971, and both now abandoned.

This invention relates to a novel presensitized positive-acting highly absorbent or opaque layer on a transparent or translucent carrier and a process for producing the same. A second feature of the invention relates to the deposition of an opaque surround on glass for use in making television picture tubes.

In a positive-acting system, the image areas of the exposed and developed sheets correspond with the opaque areas of the transparency, whereas the non-image areas, which are transparent and colorless, correspond with the light-transmissive areas of the transparency. When coatings are made on glass for picture tube usage, the opaque areas correspond to the opaque portions of the mask and the windows or transparent areas correspond to the openings in the shadow mask. In a negative-working system the image areas of the exposed and developed sheets correspond with the light transmissive areas of the transparency, whereas the non-image areas correspond with the opaque areas of the transparency.

It is known in the preparation of reproduction products that highly absorbent patterns can be obtained by exposing silver halide emulsions to electromagnetic radiation by means of projection through air, films, and solid objects of various densities or by reflection from another surface, as in a camera for example, and then developing the exposed area. It is known also that other materials and coatings can be used in a manner similar to silver halide emulsions for generation of highly absorbent patterns. Exemplary of such materials are diazo type coupling systems, dichromated colloids and photoresists based on polyvinyl cinnamate resins and the like. The highly absorbent patterns which are produced with these latter two materials frequently are obtained by dyeing the substantially transparent patterns prior to or after the development process. If highly absorbent dyes or pigments are incorporated into the coatings, the amount of illumination required to produce a satisfactory image is increased in proportion to the density of the opaque materials. To produce black patterns, the exposure times are in the range of 2 minutes to 30 minutes or longer, depending upon the light sensitivity of the active components of the coating and the density of the opacifying agent.

To illustrate the undesirable effect upon exposure of opaque materials in light-sensitive coatings, reference is made to U.S. Pat. No. 3,365,292. In column 1, lines 59 to 66 of this patent, the effect upon exposure of a photoresist coating containing black pigment is described, and it is stated therein that the light-absorbing properties of the black pigment either prevent the actinic light from fully penetrating the layer of photoresist as required, or impose a prohibitively long exposure time. To overcome this problem the patentee discovered that he can add an optically transparent filler to a photoresist coated upon a glass support which after exposure and development is converted to a permanently opaque state. Although acceptably short exposures are obtained, an expensive and time-consuming baking operation is needed, which is moreover unacceptable when the support is a plastic or other substance which is not heat resistant.

A typical example of the state of the art of positive acting systems, suitable for making both black and colored duplicates of originals, is the product covered by U.S. Pat. No. 3,326,682. It describes positive-working color proofing foils in which a coating, comprising an intimate mixture of light-sensitive orthonaphthoquinone diazide and alkali fast dye is coated upon a transparent support. Such foils are imaged by placing a mask in direct contact with the coated surface and by exposure to actinic radiation followed by a developing step. The resultant image has good resolution. However, exposure times are very much dependent upon the density of the color of the coating since the actinic light must penetrate the entire thickness of the coating in order to achieve developability. Reasonably short exposures are obtained only with the lighter colors which absorb little of the actinic radiation. Consequently, the product has severe limitations which cannot be overcome but can be ameliorated only by deliberate reduction of the density of the coating. Truly black high density patterns for instance cannot be made within acceptable exposure times. Thus, the system has severe drawbacks and needs improvement.

Another positive-working system, by which opaque patterns can be obtained is described in U.S. Pat. No. 3,211,553, to Ito. Ito makes a positive-acting color proofing film by coating a corona-treated polyester film with the reaction product of poly-complex oxygenated anion, for example, phosphotungstic acid and para diazo diphenylamine monomer. The light-sensitive surface so formed is overcoated with polyvinyl formal containing a phthalocyanine blue pigment to make a cyan color proofing film. Similarly, magenta and yellow films are made by using appropriate color pigments.

The coated sheets are exposed imagewise to ultraviolet radiation through the transparent support (called "back-exposure"). This back-exposure has the advantage that the exposure time is less than if exposed through the upper light-absorbing pigmented layer. It, however, has the disadvantage that imagewise exposure through the base results in a loss of resolution.

After exposure, the sheets are developed to remove the photodecomposed areas and with them the overlying pigmented coating, revealing a positive image on a clear polyester support. At this point, the image is still light-sensitive and due to the yellowish color of the light-sensitive diazonium material its color is not true. To correct the off-color, the image is now fully exposed in an exposure frame and then bleached (but not subjected to developer action which would, of course, remove all of the image). Finally, the film is washed, rinsed and dried.

For the users of this positive-acting proofing film, the required sequence of imagewise exposure, development, overall exposure to destroy remaining sensitizers, bleaching, washing and then rinsing is time consuming and troublesome. Furthermore, the imagewise exposure through the back results in an undesirable loss of resolution. Consequently, the material of Ito is also not entirely satisfactory.

Although not explicitly discussed in Ito, diazo photosensitive materials in thin coatings used to make copy films, proofing film and printing plates, all require intense ultraviolet light to initiate the photochemical reaction. Ultraviolet light is usually considered to have a wavelength of approximately 400 nanometers. The relative insensitivity to higher wavelength is advantageous both in manufacturing and user handling, in that all operations can be conducted under subdued light or yellow light as the sensitivity of the coatings to such light is negligible. Consequently, any exposure of the coatings of Ito or any other diazo type coating to subdued safe light is of no moment and has no effect upon the observed results. Exposure to such subdued light can in no way be compared to exposure to ultraviolet radiation; only the second is actinic for diazo type coatings.

Both in the description of the process of making a positive color image from a camera positive by exposure through the back, and throughout the Ito patent, is reiterated the fact that a positive-working diazo is decomposed by ultraviolet light, such as is emitted by a carbon arc, in the light-struck areas to a material which is readily washed away, confirming hereby what has long been well known in the art of the use of positive-working diazos. As opposed to this, negative-working diazos and also photopolymer systems react in just the opposite way in that exposure to actinic light, such as that emitted by a carbon arc, result in either decreasing the solubility of the material, or enhancing its bonding to the substrate or both.

Examples of such negative-working systems are for instance Thommes, U.S. Pat. No. 3,241,973. This patent relates to a process for anchoring a negative-working photopolymer layer to a support by means of a second negative-working photopolymer composition, the latter functioning as an adhesive. The typical photopolymerizable materials employed by Thommes are ethylenically-unsaturated compounds capable of forming high polymers by free radical-initiated chain propagating addition polymerization.

In this instance, the spectral range of photosensitivity of the adhesive and photopolymer layers is differentiated by choice of initiators. The use of different radiation sources and light filters is also possible. The adhesive layer then can be photopolymerized first and independently, even though the two layers are in contact. If the support is opaque, the exposure is made from the emulsion side. The upper photopolymer layer is formulated in a manner such that it is not affected in the time required to polymerize and harden the adhesive layer. If the support is transparent, this is not as necessary in that the adhesive layer can be exposed through the support. In either case the plate or film is next exposed imagewise through the upper polymerizable layer to photo harden the image. Contrary to the positive-working system referred to above, development removes the unexposed areas, resulting in a relief image suitable for printing.

An additional example of a negative-working system in which exposure to actinic light such as is emitted by a carbon arc results in a decrease in solubility of the coating is Thommes, U.S. Pat. No. 3,259,499. It describes photopolymerizable elements which may be placed upon opaque or transparent supports, which are of the same class as described in Thommes, U.S. Pat. No. 3,241,973. The element can be exposed through the base so that only the lower stratum becomes polymerized and this photopolymerizable stratum, as is normal upon exposure of negative-working systems, becomes resistant to the action of the usual developing solvents. Thus, the two Thommes patents covering negative-working systems are essentially similar and differ from the positive-working systems in that exposure results, as expected, in a decrease in solubility, whereas in the positive-working systems such as that of Ito, exposure results, also as expected, in a conversion to a material readily washed away.

Further, Miller et al, U.S. Pat. No. 3,635,711, resembles the Thommes patent, in that it also employs negative-working photopolymerizable compositions which are made into relief plates by steps which include exposure of these compositions through a transparent base to effect photo-hardening at the interface, and an imagewise exposure through the front. Here also, exposure results according to theory in an insolubilization of the coating as opposed to Ito, where exposure, as is well known in the art, converts the positive-working material into a state in which it can be readily washed away.

Haas et al, U.S. Pat. No. 3,671,237, describes still another negative-working imaging system, in which the unexposed portions are subsequently removed by a developing step. Essentially light-absorbing particles are caused to adhere to a substrate by the direct action of an imagewise intense radiation thereupon. With the removal of the unexposed particles by a high pressure gas jet, the image is revealed. This is the developing step. If the support is transparent, an alternative developing technique is used which is to radiate through the support. This serves to blast away the particles which have not been acted upon by imagewise exposure. Thus, again exposure forms the image areas which become unremovable by the developer, whereas in Ito exposure forms the non-image areas by rendering the exposed material soluble.

Although there are, as described above, several negative-working systems by which opaque images of adequate resolution within reasonable exposure times can be obtained, there is a great need for an improved positive-working system in which upon imagewise exposure, in reasonably short exposure times, the area struck by light can be developed and thereby removed resulting in highly opaque images of excellent resolution. Therefore, one object of this invention is to provide such a material. A further object of the present invention is to combine the highly opaque pigmented materials with the light-sensitive diazo coating, so that the resulting opaque coated film can be obtained from a single coating operation. Still a further object of the present invention is to provide an improved method of utilizing black or opaque pigments to establish a screen structure of a color image reproducer having by a light absorbing border for the elemental phosphor areas. A still further provision is a method for imaging positive photoresists containing graphite, pigments, dyes and other opaque materials whereby imagewise exposure time can be reduced by 70% or more.

Quite unexpectedly and contrary to all theory, it was found that a positive-acting coating on a transparent or translucent carrier fulfilling all the requirements of excellent resolution and short exposure time and yeilding highly opaque images can be produced by the simple method of overall exposure of the coated material from the backside followed by a short imagewise exposure from the emulsion side prior to development. Superficially, this system resembles the one used for instance by Thommes in U.S. Pat. No. 3,241,973, which utilizes an overall exposure through the support followed by an imagewise exposure through the front. However, it is readily seen that the differences are great in that the Thommes system is predictable since negative-acting photo layers, as is well known in the art, are photohardenable and become insoluble upon exposure. Thus, the purpose and action in Thommes to harden the bottom of the layer in contact with the support, thus to act as an adhesive, can be readily achieved by exposure through the back. In contrast, the overall exposure through the base of a positive system such as is utilized in the present invention, would be expected to eliminate adhesion of the photo layer because it is photo-decomposed and, as is well known in the art, thereby becomes readily soluble. Thus, upon development after imagewise exposure through the front, the entire coating should be readily washed away. This, rather unexpectedly, for reasons not fully understood, does not occur. It is evident that the chemistry, specifically the photo reaction as well as the purpose of Thommes differs radically from the present invention and above all from the results obtained. Furthermore, the Thommes results can be expected and are predictable by theory, whereas the results of the present invention are totally unexpected and contrary to the teachings of the prior art.

The light-sensitive element employed in the process of the present invention comprises (1) a support of transparent or translucent plastic film such as polyester, polyimide, polycarbonate, polystyrene, polypropylene, cellulose acetate and the like, or glass, or combinations of paper and plastic coatings, and (2) a positive-working light-sensitive layer having a weight of up to 20 grams/square meter, preferably 0.2 to 15 grams/square meter when dry, and containing light-sensitive diazo compounds (such as quinone diazide compounds of the type disclosed in U.S. Pat. No. 3,148,983, for example), optionally, one or more binders such as: novolak resins and maleic acid-styrene copolymers and one or more pigments or dyes and/or dyestuffs. The ratio of resins to diazo compound preferably is in the range of 6 to 1 by weight, although other weights may be employed and no resin is absolutely necessary. The quantity of pigment or dyestuff in the dry coating may vary between 5 to 50 percent by weight and preferably is in the range of 10 to 40 percent by weight of the coating.

The addition of graphite, carbon black, or organic pigments usually requires high speed blending of a previously dispersed material such as is obtained by ball milling. The finer dispersions are obtained by milling from 1 to 24 hours at room temperature (25° C.).

The coating solutions can be applied to the substrate by any of the common techniques such as dip, whirling, spray, wire bar and the like. The exposure of the coated materials can be made with any source of actinic light. Exemplary of such sources are carbon arcs, mercury vapor lamps, Xenon lamps, and sunlight.

For cathode ray screens, the overall exposure through the support and the imagewise exposure through the film transparency or shadow mask can be made immediately after the coating dries or at any time thereafter. The mask is positioned on the coated side of the support and the several exposures are made through the mask using a point light source to expose the "windows". Contact exposure is suitable when film carriers are to be imaged. A suitable overall exposure is also made through the support at any time in the procedure.

After rear exposure and imaging, the exposed coating is removed by dipping it in a bath or spraying with the developer, or wiping with a cotton pad soaked with the developer. The developer may be, for example, an aqueous alkaline solution containing salts, such as sodium phosphate, sodium metasilicate, sodium hydroxide, and mixtures of these or other alkaline materials and solvents. Development is followed by a water rinse and the reproduction materials are then air-dried.

The invention will be further illustrated by reference to the accompanying drawings which show the exposure steps of the invention.

FIG. 1 shows the light-sensitive material of the invention, which comprises the clear or translucent support 10 having the opaque light-sensitive coating 12 thereon.

Figure 2:
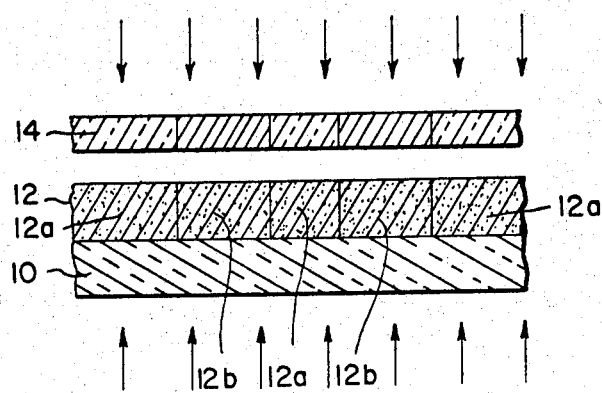

FIG. 2 shows the exposure of the light-sensitive coating 12 through the positive transparency 14, the areas 12a being the areas which are exposed through the positive transparency and the areas 12b being the areas which are unexposed through the positive transparency. Furthermore, the light-sensitive material is totally exposed from the bottom through the base 10 whereby both the top and the bottom sides may be exposed in either sequence, or simultaneously, in order to obtain the benefits of the present invention, i.e., a greatly reduced exposure time both overall and especially imagewise.

Figure 3:
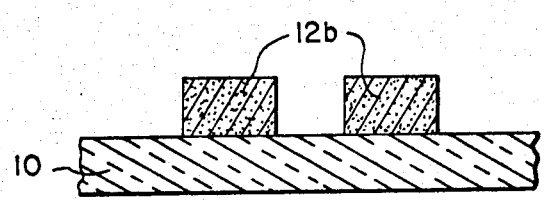

FIG. 3 shows the developed light-sensitive material in which the light-sensitive coating has been decoated in the imagewise exposed areas leaving the areas 12b, which were unexposed through the positive transparency, but exposed through the base on the clear or translucent support 10.

In typical use for the positive-acting light-sensitive coating on transparent supports, the invention is practiced by first exposing the coating uniformly through the support to actinic light to create a unique product which now requires significantly lower exposure when later irradiated with actinic light from the face of the coating by emulsion to emulsion exposure through a mask or image transparency, a prerequisite for obtaining high resolution. While it has been found that the sequence of imagewise and overall exposure is immaterial, it is clear that more technical utility is obtained by practice of the invention when the photosensitive foil is first exposed uniformly through the support, prior to imagewise exposure through the other surface.

It is believed that the chemical structure of the photosensitive coating composition layer is altered as a result of overall exposure through the support. Initially, as prepared, the coating is a homogeneous solid solution of a quinone diazide in binder, if present, and a colorant. After an overall exposure through the support to actinic light, the quinone diazide is substantially photodecomposed at the surface of the support. As actinic light is absorbed, both by the colorant present, and by the quinone diazide, its intensity decreases as does the degree of photodecomposition, as the distance from the support increases within the coating layer. In effect, a gradient is created with maximum photodecomposition at the interface of the support and photosensitive layer and a minimum at the surface of the photosensitive layer in contact with air. Experimental evidence for this representation is given in Example 17 below.

Although there is substantially complete photodecomposition at the surface of the support, and hence solubility in developer in an overall pre-exposed coating, immersion in a developer solution for a period equal to and even somewhat greater than that used for normal development will not cause the pre-exposed layer to wash away. This is so because the top surface of the coating is substantially unexposed and remains insoluble in the developer preventing access of the developer to the photodecomposed zone closest to the support.

When the overall exposed film is imagewise exposed from the other side, vertical channels of photodecomposed (and therefore developer soluble) matter are formed corresponding to the rays of actinic light, which meet the zone of photodecomposed matter already formed by the first overall exposure. Developer can readily penetrate in these channels and reach the surface of the support to remove the unwanted, non-image areas. Development is evidently completed quickly enough to avoid any possibility of washing away the entire coating. At most, there may be a slight undercutting of the bases of dots forming the image in the case of a screened halftone reproduction. The degree of undercutting is insufficient to affect the image quality.

When a 21-Step Stouffer Exposure Scale is imagewise exposed with a normal coating, not overall pre-exposed through the support, not only is a long exposure required but the scale shows five to six steps of gray tones, indicating a similar profile in halftone dots. In contrast, when the coating is first given an overall exposure as in the practice of the present invention, not only is the imagewise exposure time reduced, as previously noted, but additionally, the number of grey steps on the Stouffer scale is reduced to one. This indicates that a sharp dot is formed, which is considered highly desirable in halftone, screened reproduction.

Also, rather unexpectedly, the coated film may be exposed overall through the emulsion and imagewise through the base in any sequence of these two operations with a resultant shortening of the imagewise exposure requirement, but obviously with a loss of resolution.

For convenience in defining exposure relations, it is preferred to call normal exposure that amount of actinic energy needed to image the coating when irradiating from one side only followed, as shown in the examples, by standard development in a developer solution normally used for this operation. It has been found that if one exposes overall through the support to increasing amounts of actinic energy, followed by standard development, one reaches a maximum exposure level marked by a noticeable deterioration of coating uniformity after normal development when viewed by transmitted light. The deterioration may take the form of pinholes, suddenly increased susceptibility to scratching, void areas of various sizes, and the like. Any greater exposure results in drastic coating loss and its useless.

Any overall exposure through the support under the maximum in which highlight dots are not lost after halftone imaging is beneficial within the scope of the invention. The longer the overall exposure through the base, the shorter is the required imagewise exposure from the other side. As a further unexpected beneficial result, contrast is increased over that obtained by normal exposure, particularly when higher levels of overall exposure are employed, making dots harder.

Also, it has been found that there is a finite minimum exposure which still results in a practical shortening of imagewise exposure. This minimum useful overall exposure is about one-half of one percent of the aforedefined normal exposure and results in at least a 10% reduction from normal exposure. Throughout the range from minimum to maximum there is a corresponding shortened imagewise exposure which may be readily determined by experiment, in a manner well known in the photographic arts.

While the invention is of maximum advantage in reducing imagewise exposures of the densest coated films, it is also useful in adjusting the exposure for foils of relatively low optical density, as for example in a set of four-color proofing foils to obtain equal exposure times for all colors. This facilitates automation.

For example, a black foil which required a normal exposure of 320 seconds, was made imageable in only 10 seconds by first exposing it overall through the base for 60 seconds. This is an exposure reduction of over 95% from the normal.

Also, rather unexpectedly, the same black foil could be exposed in the reverse manner in that overall exposure was made through the emulsion and imagewise exposure through the base. This mode is also usable whenever maximum resolution is not required and results in a desirable shortening of overall exposure.

The invention is also applicable to Minnesota Mining and Manufacturing Corporation's Positive Color Key, U.S. Pat. No. 3,211,553, gaining for this product the improved resolution benefit of emulsion-to-emulsion exposure. The photosensitive material is a complex with p-diazodiphenylamine sensitizer in bi-layered configuration. The diazo complex layer is in contact with the support and has a separate color layer coated on the top thereof. The film is intended to be exposed imagewise through the base and required a 28-second exposure determined by experiment. If exposed imagewise through the emulsion under the same light source, the required exposure was 720 seconds, which although it gave improved resolution, is impractical. However, only 10 seconds of overall exposure through the base was needed in order to make possible an imagewise exposure of 28 seconds through the emulsion.

The benefit of the overall exposure is durable, there being no known fading of the effect upon storage. Nor are there other observable unwanted side effects. This virtue makes possible the convenient use for graphic arts of foils at a much later date which have been previously exposed overall through the support.

Such pre-exposed foils may be conveniently handled under safelights such as commonly used gold fluorescent lamps which have virtually no actinic content. Typical foils have been left under such safelights for as much as eight hours with no detectable changes.

Pre-exposure through one surface of the colored films has the additional advantage of decomposing enough of the yellowish-colored diazo sensitizer that in selected cases a post-exposure to attain true color value no longer is necessary.

Many factors influence the normal exposure of positive-acting color foils: nature and density of colorant, thickness of coating, kind and amount of diazo sensitizer, kind and amount of resin binder, solvents used in coating, even the nature of the support and coating techniques. By prolonged investigation, many of the results of which are set forth in the examples, it has been found that in all cases, a valuable exposure reduction results from the use of the teachings of this invention.

The invention will be further illustrated by reference to the following specific examples

EXAMPLE 1

A positive-working light-sensitive coating containing: 2.5 parts by weight of metacresol-formaldehyde novolak resin, 0.6 part by weight of naphthoquinone diazide sulfo ester, as described in Example 1 of U.S. Pat. No. 3,148,983, 1.0 part by weight of powdered graphite,
8.0 parts by weight of ethylene glycol monoethyl ether acetyl ester
1.0 part by weight of butyl acetate, and
1.0 part by weight of xylene was coated onto a glass plate for two minutes and dried at a temperature of 100° C. An aperture mask, similar to one used in a tri-color cathode ray tube, was placed in front of the coating and then illuminated for 10 minutes with a 1500 watt memory vapor tube at a distance of 1.5 feet in order that the exposed areas could be completely removed with an alkaline developer solution.

However, if the sample is first exposed through the glass support for 75 seconds before or after exposing the coating through the aperture mask for 105 seconds, an image of equal quality is obtained after development with the same alkaline solution for the same length of time. A reduction in exposure time of 70 percent is thereby realized. The resulting pattern is rendered suitable for laying down phosphor materials in their respective positions as described in U.S. Pat. No. 3,365,292.

EXAMPLE 2

The light-sensitive coating as described in Example 1 was coated onto a polyester film and dried. A positive half-tone film transparency was placed in contact with the coated surface and exposed for 10 minutes to a 1500 watt mercury vapor tube at a distance of 1.5 feet before the image could be completely developed with an alkaline aqueous solution.

An exposure through the polyester support to the same light source for 75 seconds before or after exposing through the positive transparency for 105 seconds enabled the coating to be completely removed in the exposed areas without loss of image quality when developed with the same alkaline developer.

EXAMPLE 3

A coating solution as described in Example 1 with the exception that 3.6 parts of resin instead of 2.5 parts were coated onto a polyimide sheet and, after drying, the further procedure as described in Example 2 was followed. A reduction in total exposure time of 70 percent was obtained by exposure through the support for 75 seconds prior to or after exposure through the film transparency.

EXAMPLE 4

A light-sensitive coating solution as described in Example 1 containing 1.5 parts by weight of carbon black instead of the pigment was applied to a translucent polyester film. Processing was a described in Example 2, and similar results were obtained.

EXAMPLE 5

A light-sensitive coating solution as described in Example 1, with the exception that 1.5 parts by weight of an organic basic black dye, such as He-801 Fast Black HB, was used instead of the pigment, was applied to a clear polyester film. Processing was as described in Example 2 above. A high density black image was formed duplicating the original transparency.

EXAMPLE 6

A light-sensitive coating solution containing 9 parts by weight Kodak KAR (described in U.S. Pat. No. 3,526,503) and 1 part by weight of powdered graphite was applied to a polyester film. The exposure source, distance and developer were the same as in Example 2. A positive transparency was placed in contact with the coated surface and exposed for 5 minutes before the image could be completely developed. Another sample of the same coating was now exposed overall through the support for 40 seconds. Following this pre-exposure, only 50 seconds exposure through the positive transparency in contact with the coating was necessary to obtain a satisfactory image. Development time was 150 seconds.

EXAMPLE 7

A positive-working light-sensitive coating of the following composition was dissolved in suitable aliphatic solvents and coated upon a sheet of polyester film:

| | |
|---|---|
| Meta cresol-formaldehyde novolak resin | 1 gram |
| Condensation product of trihydroxy benzophenone with 2-diazo-1-naphthoquinone-5-sulfochloride | 10 grams |
| Solvent soluble, alkali-fast black dye | 6 grams |

A black coating of uniform appearance resulted. After removal of the solvent, the film was measured in a Hunter colorimeter and a Macbeth color densitometer:

| | |
|---|---|
| Hunter "L" Value | 8 |
| Green Filter Density (Macbeth) | 2.2 |

Samples of film were exposed overall through the base for various intervals using a 5,000 watt mercury halide source at a distance of 30 inches. Half of the sample representing each such overall exposure through the base was further exposed imagewise from the other side for various times to determine needed exposure. The other half was retained. After exposure, all samples were developed manually at room temperature for one-half minute in an aqueous alkaline developer, examined visually. The exposure times and observations after development were as follows:

| OVERALL EXPOSURE THROUGH BASE | | IMAGEWISE EXPOSURE |
|---|---|---|
| Time, seconds | Appearance of film after development | Emulsion side; seconds |
| 0 | No change from original foil | 320 |
| 1.3 | No change from original foil | 288 |
| 5 | No change from original foil | 160 |
| 30 | No change from original foil | 30 |
| 60 | Slight pinholing | 10 |
| 80 | Severe developer attack | Not usable |
| 100 | Total removal of coating | Not usable |

In this example, 60 seconds is the maximum overall exposure through the base.

EXAMPLE 8

A sample of the film of Example 7 was exposed overall through the emulsion for 5 seconds. When imaged for 160 seconds through the base carrier and developed, a duplicate of the original was obtained Correspondingly, a pre-exposure for 10 seconds was made. Now, when imaged for 60 seconds through the base and developed, a duplicate of the original was also obtained.

The maximum overall exposure was found to be 15 seconds, when using the same criteria as in Example 7.

EXAMPLE 9

The composition of Example 7 was prepared and coated except that only half the weight of novolak resin was used. The density of the resulting film was 1.2 with the Green Filter on the Macbeth color densitometer, and the Hunter "L" value was 19—indicating a less black coating.

Overall exposures through the base and imagewise through the emulsion were made as in Example 7. Corresponding data were:

| OVERALL EXPOSURE THROUGH BASE | | IMAGEWISE EXPOSURE |
|---|---|---|
| Time, seconds | Appearance of film after development | Emulsion side; seconds |
| 0 | No change | 80 |
| 5 | No change | 30 |
| 10 | No change | 20 |
| 15 | Slight pinholing | 7 |

EXAMPLE 10

A positive-working light-sensitive coating of the following composition was dissolved in suitable aliphatic solvents and coated upon a sheet of polyester film:

| Black dye of Example 7 | 2 grams |
|---|---|
| Sensitizer of Example 7 | 3 grams |

The density of the resultant film was 0.9 with the Green Filter on the Macbeth color densitometer and the Hunter "L" value was 29. The film was exposed at various times and developed in dilute aqueous alkali and the appearances noted as in Example 7. The corresponding data were:

| OVERALL EXPOSURE THROUGH BASE | | IMAGEWISE EXPOSURE |
|---|---|---|
| Time, seconds | Appearance of film after development | Emulsion side; seconds |
| 0 | No change | 40 |
| 4 | No change | 12 |
| 6 | No change | 7 |
| 8 | Slight pinholing | 4 |

EXAMPLES 11, 12, 13

Three colored compositions were dissolved in suitable aliphatic solvents and separately coated on a polyester support. The first contained yellow dye, the second contained a magenta, and the third contained a cyan dye. All dyes were solvent soluble and alkali fast.

| | Weight in Grams | | |
|---|---|---|---|
| Component | Example 11 | Example 12 | Example 13 |
| Color | Yellow | Magenta | Cyan |
| Dye | 3 | 2 | 2 |
| Sensitizer of Example 7 | 7 | 6 | 7 |
| Hunter "L" Value | 82 | 42 | 48 |
| Color Filter Density (Macbeth) | 0.6 Blue | 1.04 Green | 1.0 Red |

Samples of each of the films were exposed for varying lengths of time and then developed as in Example 7. The corresponding data were identical for each of the three colored films:

| OVERALL EXPOSURE THROUGH BASE | | IMAGEWISE EXPOSURE |
|---|---|---|
| Time, seconds | Appearance of film after development | Emulsion side; seconds |
| 0 | No change | 20 |
| 0.08 | No change | 18 |
| 1 | No change | 15 |
| 2 | No change | 10 |
| 3 | Pinholing (slight) | 3 |

The 0.08 second value was calculated from data obtained with an Aristo Grid SD-39 source calibrated against the mercury halide 5,000 watt source used in all the other exposures.

EXAMPLE 14

The following composition was dissolved in a suitable aliphatic solvent and whirler coated on a polyester support:

| Black dye of Example 7 | 2.7 grams |
|---|---|
| Condensation product of $\beta$-naphthol and formaldehyde further reacted with 2-diazo-1-napthoquinone-5-sulfochloride | 4.4 grams |

The resultant film had a Hunter "L" value of 19 and a Green Filter density of 1.25. Its normal exposure time was 80 seconds. When a sample of the film was uniformly exposed through the base for 5 seconds and imagewise exposed through the emulsion for 30 seconds, an excellent image after development was obtained.

EXAMPLE 15

The procedure of Example 14 was followed except that the sensitizer used was 4.4 grams of the condensation product of cumyl phenol and 2-diazo-1-naphthoquinone-4-sulfochloride. The same density values were obtained as in Example 14. When uniformly exposed through the base for 5 seconds and imagewise through the emulsion for 30 seconds an excellent image after development resulted.

EXAMPLE 16

3M Positive Color Key (black) was exposed to a 5000 watt mercury halide source for various intervals to determine normal exposure according to the manufacturer's instructions. Twenty-eight seconds through the base was found to produce a solid step 4 on a Stouffer stepwedge, after development, fixing and postbleaching with light. A series of overall exposures were next made through the base, as in Example 7, followed by imagewise exposure through the emulsion and development. The results were as follows:

| OVERALL EXPOSURE THROUGH BASE | | IMAGEWISE EXPOSURE |
|---|---|---|
| Time, seconds | Appearance of film after development | Emulsion side; seconds |
| 0 | No change | 720 |
| 5 | No change | over 30 |
| 10 | Slight pinholing | 28 |

| OVERALL EXPOSURE THROUGH BASE | | IMAGEWISE EXPOSURE |
| --- | --- | --- |
| Time, seconds | Appearance of film after development | Emulsion side; seconds |
| 15 | Coating completely removed | — |

EXAMPLE 17

The positive working light-sensitive coating of Example 7 was coated upon a sheet of polyester film at reduced thickness so that the optical density of the resulting coating was one-quarter that of the film of Example 7. Thus, the green filter density (Macbeth) was 0.55. Four pieces were cut and placed one above the other. The combined optical density of the four layer was 2.2 with the green filter (Macbeth). A fifth piece of film of one-quarter density was used to determine the concentration of sensitizer present by means of U.V. spectroscopy. Now the assembly of four layers (placed emulsion to base) was exposed from the base direction for 55 seconds using a 5000 watt mercury halide source at a distance of 30″ as in Example 7. After exposure, the pieces were separated and individually analyzed for photodecomposition of the sensitizer by U.V. spectroscopy. The results were as follows:

| | |
| --- | --- |
| Layer 1 (closest to light source) | lost 98% of its quinone diazide content |
| Layer 2 | lost 70% of its quinone diazide content |
| Layer 3 | lost 30% of its quinone diazide content |
| Layer 4 (farthest from light source) | lost 15% of its quinone diazide content |

As can be seen from these data, the photodecomposition is not uniform throughout the film but is greatest, closest to the base support and least at the surface farthest from the support. Further, this corresponds to the greatest photodecomposition at the surface nearest the source of overall actinic irradiation.

It will be obvious to those skilled in the art that many modifications may be made within the scope of the present invention without departing from the spirit thereof, and the invention includes all such modifications.

What is claimed is:

1. A method for preparing a material having a reduced time requirement for imagewise exposure to actinic light comprising
  (A) providing a transparent or translucent support having a positive-acting quinone diazide light-sensitive coating composition in direct contact with one surface thereof, and
  (B) uniformly exposing said coating through said support to a source of actinic light for a period of time sufficient to substantially photodecompose the surface of said coating in direct contact with said support and form a gradient in said coating wherein the percentage of undecomposed light-sensitive quinone diazide increases with increasing distance from said support.

2. A method according to claim 1 in which said coating includes a colorant.

3. A method according to claim 1 in which said coating includes a binder.

4. A method according to claim 3 in which said binder is a novolak resin.

5. A method according to claim 1 in which said coating has a dry weight in the range of about 0.2 to 15 grams/square meter.

6. A method according to claim 1 in which the support is glass.

7. A method according to claim 1 in which the support is a film.

8. A method according to claim 1 in which the surface of said coating in direct contact with said support is photodecomposed to the extent that the time required for imagewise exposure of said material is reduced by at least about 10 percent.

9. A method according to claim 1 including the additional step of imagewise exposing to actinic light the surface of the said light-sensitive coating opposite said support.

* * * * *